United States Patent [19]

Hosaka et al.

[11] Patent Number: 4,835,399
[45] Date of Patent: May 30, 1989

[54] CHARGED PARTICLE BEAM APPARATUS

[75] Inventors: Sumio Hosaka, Nishitama; Hifumi Tamura, Hachioji, both of Japan

[73] Assignee: Hitachi, Ltd., Tokyo, Japan

[21] Appl. No.: 84,154

[22] Filed: Aug. 12, 1987

[30] Foreign Application Priority Data

Aug. 22, 1986 [JP] Japan .................................. 61-195384
Sep. 5, 1986 [JP] Japan .................................. 61-207856

[51] Int. Cl.$^4$ .............................................. H01J 27/00
[52] U.S. Cl. ............................... 250/492.2; 250/396 R
[58] Field of Search ............ 250/396 R, 492.21, 492.2

[56] References Cited

U.S. PATENT DOCUMENTS

| | | | |
|---|---|---|---|
| 3,117,022 | 1/1964 | Bronson et al. | 250/492.21 |
| 4,315,153 | 2/1982 | Vahrenkamp | 250/452.21 |
| 4,457,803 | 7/1984 | Takigawa | 250/492.21 |
| 4,476,393 | 10/1984 | Taya | 250/492.21 |
| 4,486,664 | 12/1984 | Wollnik | 250/396 R |
| 4,609,809 | 9/1986 | Yamaguchi et al. | 250/492.2 |
| 4,641,034 | 2/1987 | Okamura et al. | 250/398 |
| 4,697,086 | 9/1987 | Ishitami et al.1 | 250/356 R |

FOREIGN PATENT DOCUMENTS 0162468 11/1985 European Pat. Off.

OTHER PUBLICATIONS

"Maskless Ion Implantation Tech.: Be and Si Implantation in GaAs", Hashimoto et. al., *Japanese Journal Oyo Butsuri (Applied Physics)*, vol. 53, No. 8 (1984) pp. 704-708 (not translated).

*Primary Examiner*—Bruce C. Anderson
*Attorney, Agent, or Firm*—Antonelli, Terry & Wands

[57] ABSTRACT

Positive and negative particles are emitted from the same emission portion of a charged particle source. In a charged particle optical system, the ions or electrons having a particularly energy among the emitted charged particles are selectively passed and their blanking is performed. The magnetic field strength and electric strength in the charged particle optical system are preferably controlled by an E×B type mass separator or quadrupole mass separator provided in the charged particle optical system.

7 Claims, 4 Drawing Sheets

FIG. 2
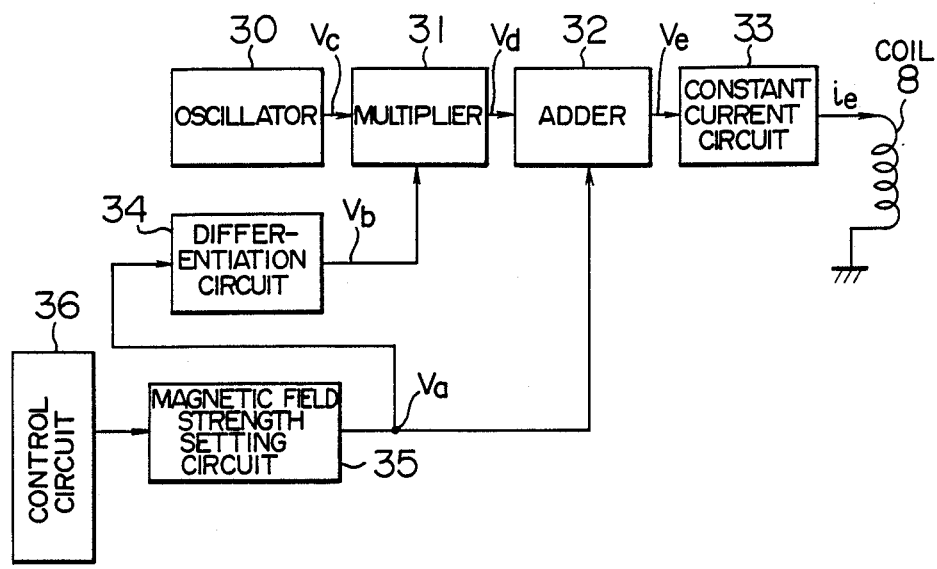
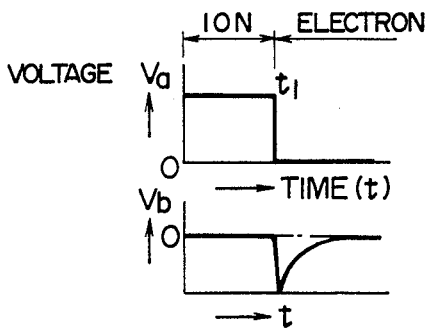
FIG. 3A
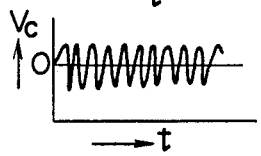
FIG. 3B
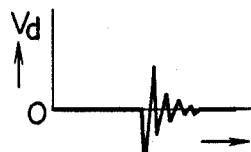
FIG. 3C
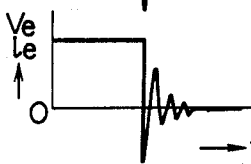
FIG. 3D
FIG. 3E
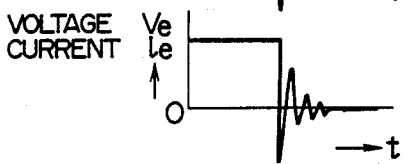

CHARGED PARTICLE BEAM APPARATUS

BACKGROUND OF THE INVENTION

This invention relates generally to a charged particle beam apparatus which can operate ions or electrons, and more particularly to a charged particle beam apparatus which includes a charged particle optical system suitable to selectively derive certain ions and electrons in the same optical system and in the same vacuum space.

One such previously known apparatus having the functions of mass separation and blanking (modulation) is a maskless ion implantation apparatus equipped with a mass separator, as disclosed in the Japanese Journal "OYO BUTSURI (Applied Physics)" Vol. 53, No. 8 (1984) pp. 704 to 708. In this prior art apparatus, in order for only certain ions to be subjected to the mass separation and blanking, an E×B type mass separator (Wien filter) is used; the above functions could be performed by varying only the electric field with the magnetic field fixed. In this prior art, however, consideration was not given to such an optical system as being capable of controlling electrons, which have very small mass, in addition to the ions. Therefore, this prior art is not satisfactory in that it is difficult to perform the functions of mass separation and blanking (modulation) for both the ions and electrons.

SUMMARY OF THE INVENTION

An object of this invention is to provide a charged particle beam apparatus which can implement the mass separation and blanking of certain ions and electrons of the charged particles emitted from a charged particle source which can emit selectively positive and negative charged particles that is, ions and electrons.

In order to attain this object, in accordance with this invention, there is provided a charged particle beam apparatus comprising a charged particle source which can emit selectively positive and negative charged particles, and a charged particle optical system which can selectively pass ions or electrons with a specific mass of the charged particles emitted from the charged particle source, and perform the blanking of the selectively passed ions or electrons.

In one preferred embodiment of this invention, unlike the E×B type mass separator in the prior art, not only the electric field but also the magnetic field is concurrently controlled to perform the selective extraction of electrons and their blanking as well as the mass separation of ions and their blanking.

The mass separator used in the charged particle optical system which can use both ions and electrons is required to perform the selected mass separation of both ions and electrons. To this end, the E×B type mass separator is most frequently used. The mass m can be expressed, in terms of the energy ev of the charged particle, by $$m = 2\,ev\left(\frac{B}{E}\right)^2 \quad (1)$$

where E: electric field, B: magnetic flux density

For example, the mass ratio of the electron to a Gd ion is $7.8 \times 10^{-6}$. In this case, with E or B fixed, the electric field strength ratio $E_e/E_{Ga}$ ($E_e$: the electric field strength when using the electrons as charged particles; $E_{Ga}$: the electric field when using the Ga ions) and the magnetic flux density ratio $B_e/B_{Ga}$ ($B_e$: the magnetic flux density using the electrons as charged particles; $B_{Ga}$: the magnetic flux density using the Ga ions are expressed as follows.

(1) when B is fixed, $$\frac{E_e}{E_{Ga}} \approx 3.5 \times 10^2 \quad (2)$$

(2) when E is fixed, $$\frac{B_e}{B_{Ga}} \approx 2.8 \times 10^{-3} \quad (3)$$

In both of the cases (1) and (2), it is preferred to carry out the blanking under the control of electric field. However, in the case of (1), as understood from Equation (2), assuming that the electrode voltage $V_p$ to be applied to parallel plates for generating the electric field in performing the mass separation of the Ga ions is 10 V, the electrode $V_p$ for the electrons is 3.5 KV. This voltage of 3.5 KV is actually difficult to control in performing the blanking, because the response to voltage cut-off, i.e. reduction to 0 volt, for beam off is too slow. On the other hand, in the case of (2), as understood from Equation (3), assuming that $B_{Ga}$ for the Ga ions is 1000 Gauss, $B_e$ for the electron is 2.8 Gauss, which is smaller than for Ga ions and so can be easily obtained. Thus, the magnetic flux density which is made variable can be actually controlled. Therefore, if the blanking using the electric field is carried out in the control manner of the case of (2), the mass separation and blanking in the charged particle optical system where both ions and electrons are operated can be implemented. Alternatively, since the mass separation can also be implemented by controlling both magnetic field and electric field, the above object can be achieved by adding the blanking function to this control method.

In another embodiment of this invention, the E×B type mass separator is replaced by an electrostatic quadrupole mass separator and a blanking device consisting of a parallel plate electrode and an aperture.

The quadrupole mass separator can pass only charged particle beams with a particular mass by controlling the magnitudes of the amplitude of the high frequency wave and the D.C. voltage while maintaining the ratio therebetween. Thus, since the mass separation can be performed without using the magnetic field, aberration due to leaked magnetic field, which is involved in the prior art can be removed.

BRIEF DESCRIPTION OF THE DRAWINGS

FIG. 2 is a block diagram of one example of the device for removing the hysteresis of the magnetic field to control the magnetic field intensity;

FIGS. 3A to 3E are waveform charts showing the output waveforms at the respective parts of the device of FIG. 2;

DESCRIPTION OF THE PREFERRED EMBODIMENTS

Figure 1:
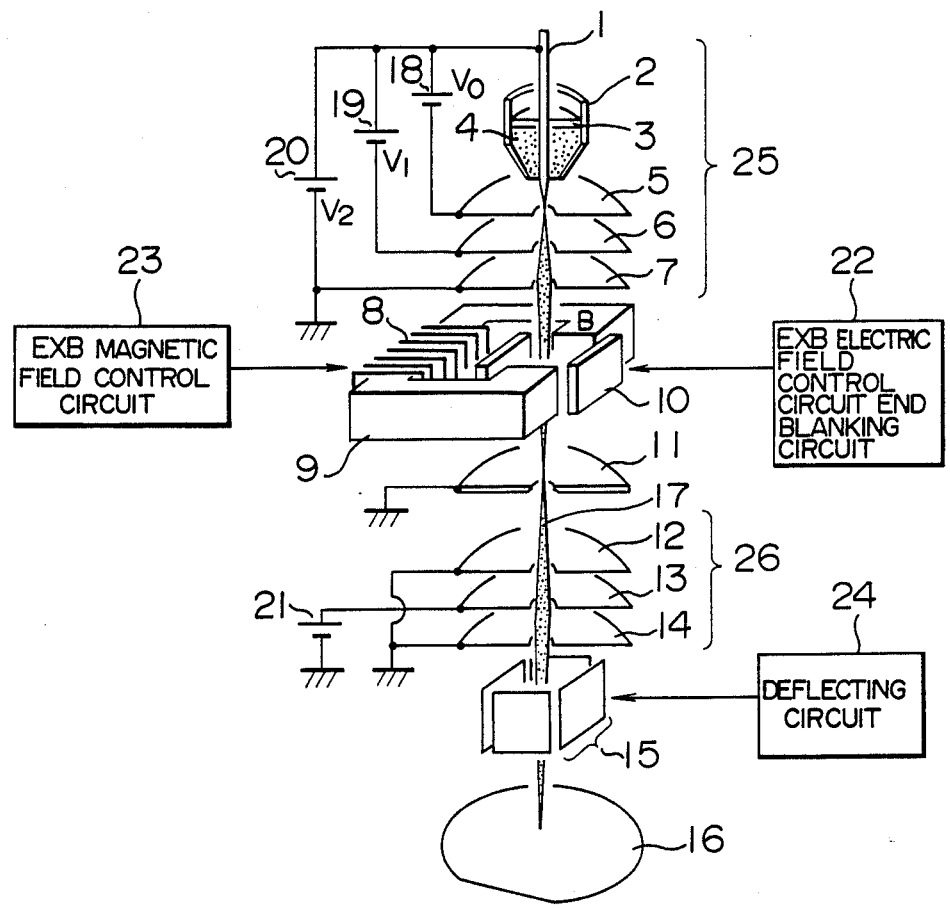
FIG. 1 shows an entire arrangement of the charged particle beam apparatus in accordance with one embodiment of this invention.

Referring now to FIG. 1, there is shown a charged particle beam apparatus in accordance with one embodiment of this invention which can perform ion etching, ion implantation, etc. by using ion beams 17 emitted from a liquid metal ion electron source 25. The charged particle beam apparatus of this invention is constructed by the liquid metal ion electron source 25, an E x B type mass separator, an objective lens 26 and a deflection lens 15. The liquid metal ion electron source 25 is constituted by a needle tip 1, a reservoir 2, material 4 for generating ions, a cap 3 for preventing the material from being vaporized, an emitting electrode 5, an intermediate electrode 6 and a post acceleration retardation electrode 7. For the purpose of illustration, means for heating the tip is omitted. The E×B type mass separator is constituted by a magnetic path 9 made of e.g. iron, a magnet of a coil 8 for producing magnetic fluxes, and parallel plate electrodes 10. Further, an aperture 11 for blanking is provided immediately below the mass separator to remove unnecessary ions or electrons.

The objective lens 26 includes three electrodes 12, 13 and 14, and the deflection electrode 15 includes a parallel plate type two-dimensional deflector. The ion beams 17 derived by voltage sources 18, 19 and 20 are supplied with selected current and voltage from an E×B magnetic field control circuit 23 and a composite circuit 22 of an E×B electric field control circuit and a blanking circuit. The currents and voltage are selected so that only desired ions pass the blanking aperture 11 and are imaged or focussed at a desired position of a sample 16 by the objective lens 26 and the deflection electrode 15. Then, the electric field and the magnetic field are controlled so as to meet Equation (1) The blanking is performed by applying a voltage to the parallel plate electrode 10 so that another kind of ions are not emitted from the aperture 11. Alternatively, the blanking can be performed by the application of magnetic field. However, the electrostatic blanking, which permits a high speed driving, is preferably adopted.

In the case where the emission of electrons is intended, the voltages from the voltage sources 18, 19 and 20 applied with the polarities opposite to those as shown in FIG. 1. The electrons emitted can be passed through the aperture 11 by controlling the magnetic field and electric field so as to meet Equation (1). This can be implemented by the method of controlling both magnetic field and electric field or the method of controlling the magnetic field with the electric field used for the ion separation being fixed. The electrons passed through the aperture 11 are imaged as a spot at a desired position of the sample 16 by the objective lens 26 and the deflection electrode 15, which permits the image observation of the sample, analysis thereof, etc. Then, since the objective lens 26 and the deflector 15 are those of an electrostatic type, the electrons are imaged or focussed on the same position as the ions. The blanking can be performed at desired timings by controlling the electric field in the E×B type mass separator using the composite circuit 22 of the E×B type electric field control circuit and the blanking circuit.

In controlling the magnetic field as mentioned above, it is desired that the influence from the hysterisis thereof is obviated by increasing or decreasing a predetermined reference current to a desired current.

Alternatively, the influence from the hysterisis of the magnetic field can be completely obviated by applying an A.C. magnetic field so as to gradually attenuate the magnetic field to be converged to a desired magnetic field. Thus, the desired magnetic field can be set. One example of implementing the above method is shown in FIG. 2 in block form. FIGS. 3A to 3E show waveforms at the respective parts of the device shown in FIG. 2.

Referring now to FIG. 2 and FIGS. 3A to 3E, when an A.C. signal for changing the magnetic strength is sent from a control circuit 36 to a magnetic strength setting circuit 35, the output voltage $V_a$ from the circuit 35 changes as shown in FIG. 3A. Namely, it changes from the ion selection mode to the electron selection mode at a time $t_1$. In this case, the electron selection mode operates with the magnetic strength being zero, and when the electron beam being "ON", the electric field must be zero. Thus, the optical system thereof is equivalent to that of the ordinary electron beam apparatus, such as an electron beam writing system.

The output voltage $V_a$ from the magnetic field strength setting circuit 35 is applied to a differentiation circuit 34 nd an adder circuit 32. In the differentiation circuit 34, a voltage waveform $V_b$ as shown in FIG. 3B is produced.

The output $V_b$ from the differentiation circuit 34 is applied, together with the output $V_c$ from an oscillator 30 as shown in FIG. 3C, to a multiplier circuit 31, which produces an output $V_d$ as shown in FIG. 3D.

This output $V_d$ is sent, together with the output $V_a$ from the circuit 35, to the adder circuit 32, thus providing an output voltage $V_e$ as shown in FIG. 3E.

This output $V_e$ is sent to a constant current circuit 33 to provide a current output having the same waveform as that of FIG. 3E. This current is applied to the coil 8.

Figure 4:
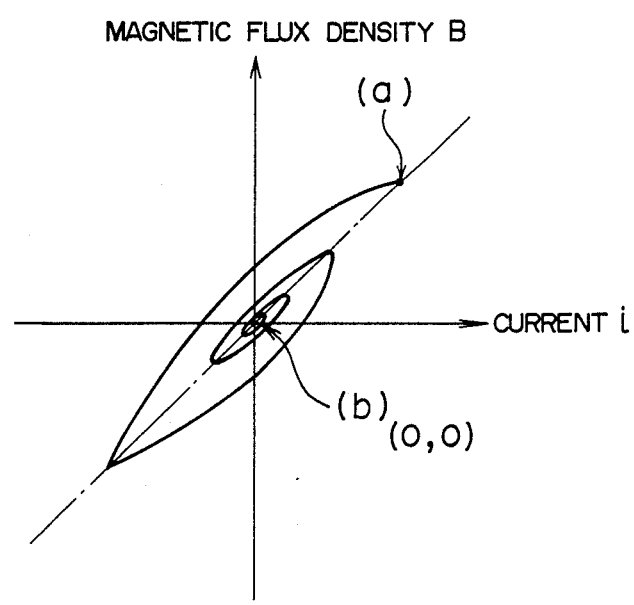
FIG. 4 is a graph showing the characteristic of the magnetic flux density vs. the coil current in controlling the magnetic field as shown in FIGS. 3A to 3E.

Then, the magnetic flux density changes from the state of (a) to the state of (b) as shown in FIG. 4. This acts to gradually attenuate the A.C. magnetic flux to be converged to a desired magnetic field strength. Although FIGS. 3A to 3E and FIG. 4 explain the shift from the ion selection mode to the electron selection mode, the same explanation can be also applied for the shift from the electron selection mode to the ion selection mode or the shift from one ion selection mode to another ion selection mode; the magnetic field can be changed to implement a magnetic circuit entirely free from the influence of the hysterisis of the magnetic field. Further, when, with the magnetic field strength being not zero, the magnetic field meets Equation (1), certain ions can be passed through the aperture 11.

FIG. 2 only shows one example of applying the current waveform as shown in FIG. 3E to the coil 8, and other means can be adopted for the purpose. A movably mounted permanent magnet such as a magnet stand may be used in place of the coil 8 to control the magnetic field strength. Further, the control circuit may be replaced by computer control. The liquid metal ion electron source 25 may be replaced by an ion source such as a duoplasmatron.

Figure 5:
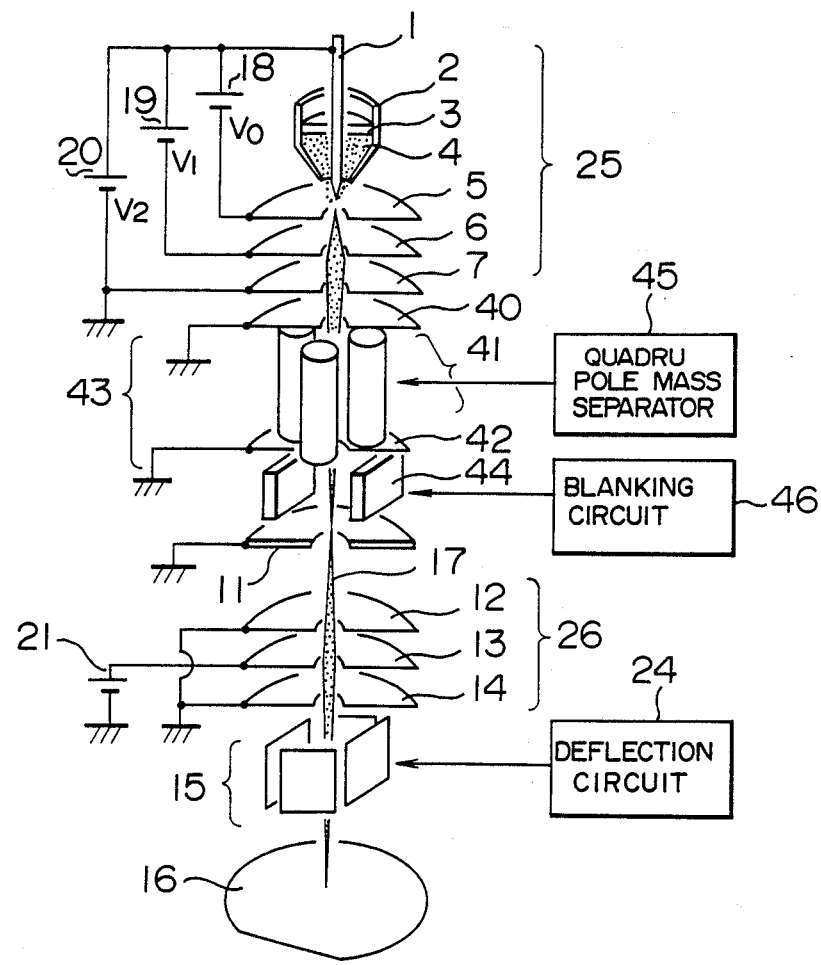
FIG. 5 shows an entire arrangement of the charged particle beam apparatus in accordance with another embodiment of this invention.

Referring now to FIG. 5, there is shown a charged particle beam apparatus in accordance with another embodiment of this invention which can be used for ion etching, ion implantation, etc. by using ion beams 17 emitted from the liquid metal ion electron source 25. In FIG. 5, like reference numerals refer to like elements in FIG. 1. The charged particle beam apparatus shown in FIG. 5 is constituted by the liquid metal ion electron source 25, a quadrupole mass separator 43, blanking electrodes 44, a beam emission limiting aperture 11, the objective lens 26, the deflection electrode 15 and the sample 16. The liquid metal ion electron source 25 is constituted by the needle tip 1, the reservoir 2, the material 4 for generating ions, the cap 3 for preventing the material from being vaporized, the emitting electrode 5, the intermediate electrode 6 and the post acceleration retardation electrode 7. For the purpose of illustration, means for heating the tip is omitted. The quadrupole mass separator 43 is constituted by an incidence limiting aperture 40, quadrupoles 41 and an emission limiting aperture 42. The blanking means is constituted by the blanking electrodes of parallel plates and the beam emission limiting aperture 11. The objective lens 26 includes an Einzel-lens consisting of three electrodes 12, 13 and 14. The deflecting electrodes 15 include a parallel plate type two-dimensional deflector.

First, the case when ions are emitted will be explained. The ion beams are emitted from the liquid metal ion electron source 25 by the application of the voltages $V_0$, $V_1$ and $V_2$ by the voltage sources 18, 19 and 20. The ion beams pass the incidence limiting aperture 40 and are incident to quadrupoles 41. The signals provided by the superposition of a D.C. component U and a high frequency component V coswt are applied to the quadrupoles 41 by a quadrupole driving circuit 45 in such a manner that $+(U+V\ coswt)$ is applied to one opposite electrodes while $-(U+V\ coswt)$ is applied to the other opposite electrodes perpendicular to the one opposite electrodes; this application is made while maintaining the U/V ratio constant so that charged beams having a particular mass can pass the emission limiting aperture 42. Thus, only certain ion beams pass the separator 43 while the remaining ion beams diverge or oscillate in the quadrupoles 41 and are trapped by the walls of the quadrupoles 41 or the beam emission limiting aperture 42. The ion beams 17 passed through the separator 43 are modulated at desired timings by the blanking electrodes 44 by control of the blanking circuit 46 which controls the blanking voltage to be zero for beam-ON and several ten volts for beam-OFF and incident to the objective lens 26. Further, the ion beams are focussed or imaged at a desired position on the sample 16 by the deflecting electrodes 15 for the purpose of ion etching, ion implantation, etc.

Electrons are emitted from the liquid metal ion electron source 25 by reversing the respective polarities of the voltage sources 18, 19 and 20. The electrons thus emitted are incident to the quadrupole mass separator 43. The electrons, which travel at a higher speed than the ions, pass the emission limiting aperture 42 without being almost subjected to the mass separation when the voltages of $\pm(U+V\ coswt)$ are applied to the quadrupoles 41, and are incident to the blanking electrode 44. The electrons modulated at desired timings by the blanking electrode 44 are focussed on a desired position of the sample through the objective lens 26 and the deflecting electrodes 15. Incidentally, it is desired that the signal to be applied to the quadrupole mass separator 43 is zero volt since in this case the electrons are not entirely influenced. The control circuit including a power source may be replaced by computer control (including software control).

In accordance with this embodiment, it is possible to provide both ions and electrons in the same optical system, and also provide those minute beams which are not entirely influenced from the leaked magnetic field of a magnetic circuit since the magnetic circuit is not used for the selection of certain ions or electrons unlike the prior art.

In accordance with this invention, in addition to providing ions and electrons in the same optical system, the following meritorious effects are obtained.

(1) Certain ions and electrons are alternately and individually emitted from the same source so that the respective properties thereof can be employed to realize a high performance charged particle beam apparatus.

(2) Because of the above effect (1), sample milling and analysis can be performed using the emitted ions and also SEM (scanning electron microscopic) images can be provided using the emitted electron beams. Thereupon, without any injury and with high accuracy, the positions to be milled and analyzed can be determined and the shape can be observed.

(3) Three dimensional observation and three dimensional analysis can be performed by means of alternate use of the ions and electrons.

(4) The apparatus of this invention can be used for circuit diagnosis. Namely, by making holes in the electrodes, etc. below surface layers through ion etching and irradiating electron probes, the performance estimation of elements can be performed and the poor-bit relief can be modified.

(5) The apparatus in accordance with this invention can be applied to a maskless ion implantation device having electron beam alignment function, etc.

We claim:

1. A charged particle beam apparatus comprising:
a charged particle source having an emission part capable of selectively emitting ions and electrons; and
a charged particle optical system associated with said source including an E×B type mass separator and means for controlling the magnetic field strength in said mass separator for selectively passing any of ions having a particular mass and electrons among the emitted ions and electrons, said system further including means for blanking the passed ions or electrons.

2. A charged particle beam apparatus according to claim 1, wherein said charged particle optical system further comprises means for controlling the electric field strength in the E×B type mass separator.

3. A charged particle beam apparatus according to claim 2, wherein the blanking of ions or electrons is carried out by operating said electric field controlling means.

4. A charged particle beam apparatus according to claim 1, wherein said magnetic field strength controlling means is adapted to control the magnetic field strength in such a manner as to increase or decrease said field from a predetermined magnetic field.

5. A charged particle beam apparatus according to claim 1, wherein said magnetic field strength controlling means is adapted to apply an A.C. magnetic field, in setting a predetermined magnetic field, so as to attenuate it to be converged to a desired magnetic field.

6. A charged particle beam apparatus according to claim 1, wherein said magnetic field strength controlling means is adapted to set the magnetic field strength to zero when selective passing of electrons is intended.

7. A charged particle beam apparatus comprising:

a charged particle source having an emission part capable of selectively emitting ions and electrons; and a charged particle optical system including a quadrupole mass separator having an input side facing said source and an output side, said separator being effective to pass any of ions having a particular mass and electrons among the emitted ions and electrons, and means including parallel plate electrodes and an aperture which are provided at the output side of said quadrupole mass separator for blanking the passed ions or electrons.

* * * * *